(12) United States Patent
Pagani

(10) Patent No.: US 9,257,499 B2
(45) Date of Patent: Feb. 9, 2016

(54) CONNECTION STRUCTURE FOR AN INTEGRATED CIRCUIT WITH CAPACITIVE FUNCTION

(71) Applicant: STMicroelectronics S.r.l., Agrate Brianza (IT)

(72) Inventor: Alberto Pagani, Nova Milanese (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 13/914,820

(22) Filed: Jun. 11, 2013

(65) Prior Publication Data

US 2013/0277803 A1    Oct. 24, 2013

Related U.S. Application Data

(63) Continuation-in-part of application No. PCT/EP11/06449, filed on Dec. 20, 2001.

(30) Foreign Application Priority Data

Dec. 20, 2010    (IT) ................ VI2010A0339

(51) Int. Cl.
| H01L 23/64 | (2006.01) |
| H01L 27/06 | (2006.01) |
| H01L 29/94 | (2006.01) |
| H01L 49/02 | (2006.01) |
| H01L 23/522 | (2006.01) |

(52) U.S. Cl.
CPC ............ *H01L 28/90* (2013.01); *H01L 23/5223* (2013.01); *H01L 28/60* (2013.01); *H01L 2924/0002* (2013.01)

(58) Field of Classification Search
None
See application file for complete search history.

(56) References Cited

U.S. PATENT DOCUMENTS

| 5,734,270 A | * | 3/1998 | Buchanan ................. 324/754.07 |
| 5,939,790 A | * | 8/1999 | Gregoire et al. .............. 257/773 |
| 6,118,321 A | * | 9/2000 | Rees et al. ..................... 327/309 |
| 6,226,322 B1 | * | 5/2001 | Mukherjee .................... 375/229 |
| 6,476,459 B2 | | 11/2002 | Lee |
| 6,597,562 B1 | * | 7/2003 | Hu et al. .................... 361/306.3 |
| 6,684,065 B2 | * | 1/2004 | Bult et al. ................... 455/252.1 |

(Continued)

FOREIGN PATENT DOCUMENTS

| CN | 1886833 A | 12/2006 |
| DE | 10046910 | 5/2001 |

(Continued)

OTHER PUBLICATIONS

Saari, Ville. Continuous Time Low-Pass Filters for Integrated Wideband Radio Receivers. Diss. Aalto U, 2011. Helsinki: School of Electrical Engineering, 2011.*

(Continued)

*Primary Examiner* — Joseph Schoenholtz
(74) *Attorney, Agent, or Firm* — Gardere Wynne Sewell LLP

(57) ABSTRACT

An embodiment, in a single structure, combines a pad including a connection terminal suitable for coupling the circuit elements integrated in a chip to circuits outside of the chip itself and at least one capacitor. By combining a connection pad and a capacitor in a single structure, it may be possible to reduce the overall area of the chip that otherwise in common integrated circuits would be greater due to the presence of the capacitor itself. In this way, the costs and size of the chip can be reduced.

9 Claims, 11 Drawing Sheets

(56) References Cited

U.S. PATENT DOCUMENTS

| | | | |
|---|---|---|---|
| 6,885,543 B1* | 4/2005 | Aram et al. | 361/313 |
| 6,891,274 B2* | 5/2005 | Chen et al. | 257/780 |
| 7,605,450 B2* | 10/2009 | Bromberger | 257/664 |
| 8,207,592 B2* | 6/2012 | Quinn | 257/532 |
| 8,299,577 B2* | 10/2012 | McLeod | 257/532 |
| 8,319,313 B1* | 11/2012 | Ben Artsi | 257/532 |
| 8,537,524 B1* | 9/2013 | Sutardja | 361/306.1 |
| 2001/0026185 A1* | 10/2001 | Sher | 327/525 |
| 2003/0234415 A1* | 12/2003 | Chien | 257/303 |
| 2005/0122119 A1* | 6/2005 | Barlow | 324/662 |
| 2005/0135182 A1* | 6/2005 | Perino et al. | 365/230.06 |
| 2005/0245102 A1* | 11/2005 | Cave et al. | 438/957 |
| 2006/0038576 A1 | 2/2006 | Tadayon | |
| 2006/0086965 A1* | 4/2006 | Sakaguchi et al. | 257/307 |
| 2006/0252162 A1* | 11/2006 | Drost et al. | 438/14 |
| 2006/0261439 A1* | 11/2006 | Chien et al. | 257/532 |
| 2006/0262822 A1* | 11/2006 | Tatum | 372/38.1 |
| 2007/0102787 A1* | 5/2007 | Goebel et al. | 257/532 |
| 2007/0102788 A1 | 5/2007 | Yang | |
| 2007/0217122 A1* | 9/2007 | Gevorgian et al. | 361/307 |
| 2008/0018419 A1* | 1/2008 | Dong et al. | 333/24 C |
| 2008/0048266 A1* | 2/2008 | Russ et al. | 257/355 |
| 2008/0099880 A1* | 5/2008 | Cho et al. | 257/532 |
| 2008/0153245 A1* | 6/2008 | Lin et al. | 438/381 |
| 2008/0274612 A1* | 11/2008 | Paul et al. | 438/666 |
| 2009/0168293 A1* | 7/2009 | Kim | 361/270 |
| 2009/0224784 A1 | 9/2009 | Pagani | |
| 2009/0257481 A1* | 10/2009 | Salcido et al. | 375/224 |
| 2010/0009511 A1* | 1/2010 | Quinlan et al. | 438/396 |
| 2010/0103571 A1* | 4/2010 | Brown et al. | 361/56 |
| 2010/0123213 A1* | 5/2010 | Chen et al. | 257/532 |
| 2010/0264954 A1* | 10/2010 | Drost et al. | 326/30 |
| 2011/0006395 A1* | 1/2011 | Dong et al. | 257/532 |
| 2011/0115512 A1* | 5/2011 | Miller | 324/754.03 |

FOREIGN PATENT DOCUMENTS

| | | |
|---|---|---|
| EP | 1696487 | 8/2006 |
| EP | 2242101 | 10/2010 |
| JP | 2008205403 | 9/2008 |
| JP | 2008205403 A | 9/2008 |

OTHER PUBLICATIONS

All About Circuits, Resonant Filters downloaded from URL<http://www.allaboutcircuits.com/vol_2/chpt_8/6.html> on May 10, 2014.*

Definition of "by" downloaded from URL http://www.merriam-webster.com/dictionary/by on Aug. 28, 2014.*

Definition of "electrode" downloaded from URL <http://www.merriam-webster.com/medical/electrode> on Aug. 28, 2014.*

Kozyraki, "Bus Scheme Comparison in a DRAM process" downloaded from URL< http://iram.cs.berkeley.edu/kozyraki/project/ee241/report/bus.html > on Aug. 29, 2014.*

Electric-Field Coupling (EMC) downloaded from URL < http://www.learnemc.com/tutorials/Electric_Field_Coupling/E-Field_Coupling.html> on Aug. 28, 2014.*

Internet Archive of URL< http://iram.cs.berkeley.edu/kozyraki/project/ee241/report/bus.html >.*

Definition of aligned downloaded from URL http://www.merriam-webster.com/dictionary/align on Feb. 16, 2015.*

Definition of aligned downloaded from URL http://www.merriam-webster.com/dictionary/align on Feb. 18, 2015.*

PacTec downloaded from URL < http://www.pactech-usa.com/index.php?option=com_content&view=article&id=34&Itemid=74 > on May 27, 2015.*

Chinese First Office Action for CN201180058905.9 dated Jul. 17, 2015 (6 pages).

Chinese Search Report for CN201180058905.9 dated Jul. 7, 2015 (2 pages).

* cited by examiner

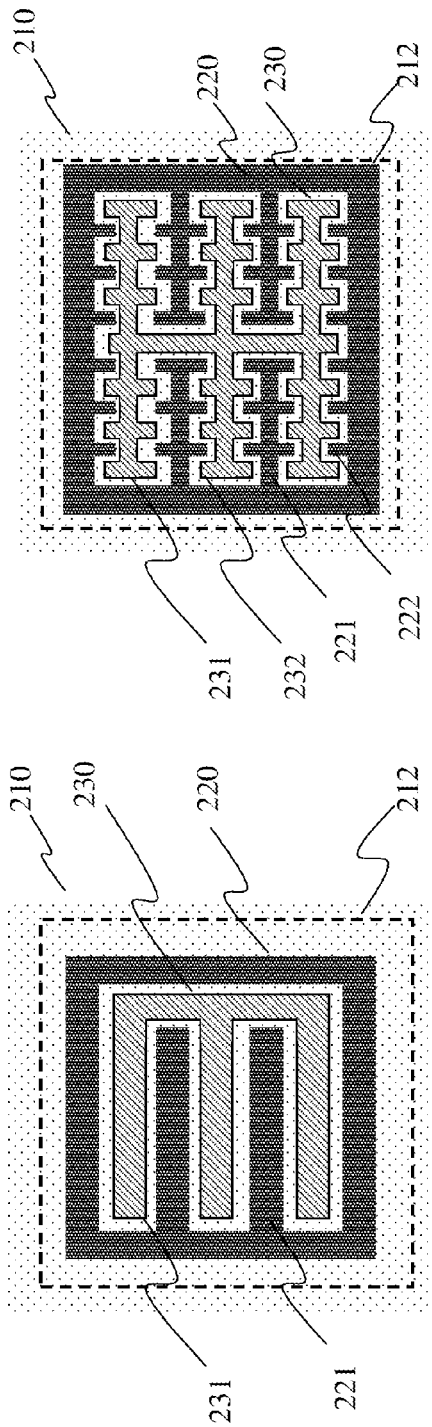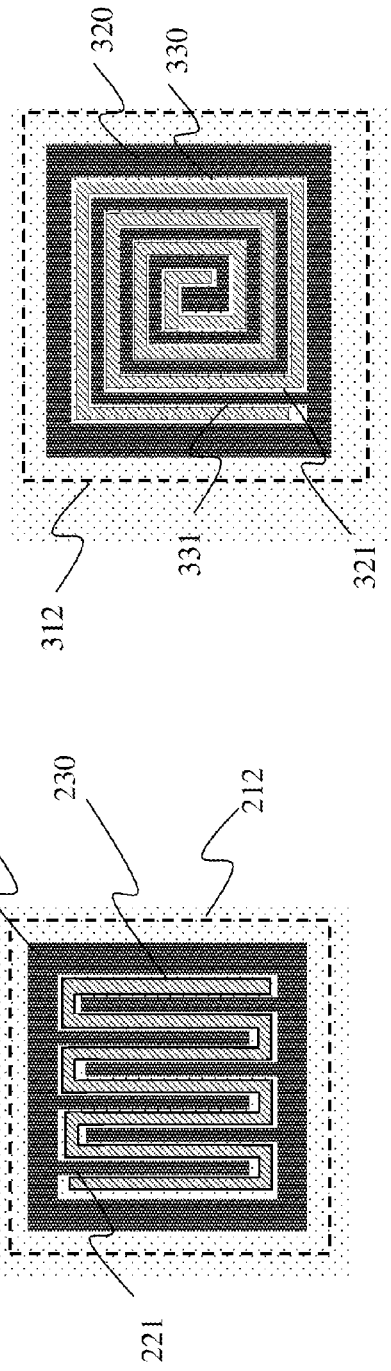

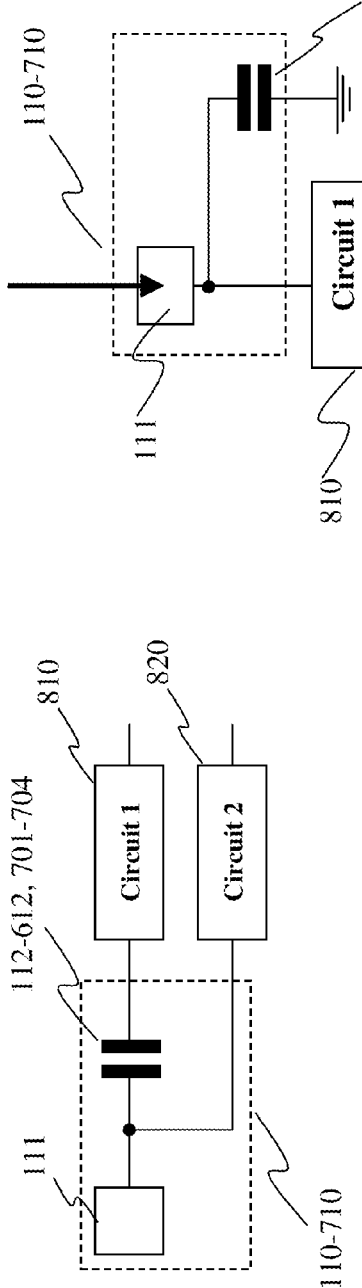
Fig. 13
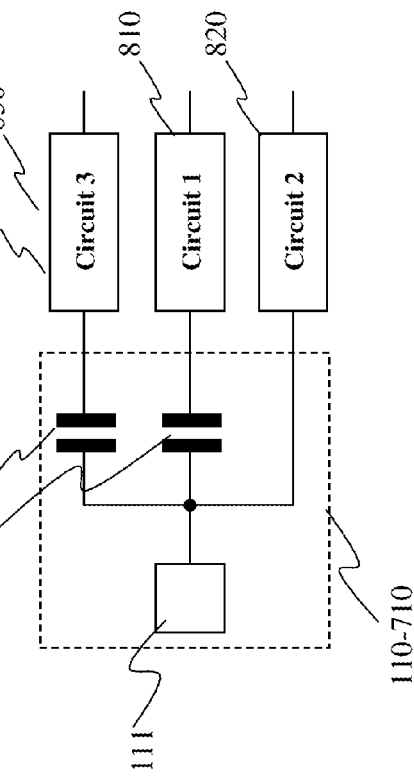
Fig. 14
Fig. 15

US 9,257,499 B2

CONNECTION STRUCTURE FOR AN INTEGRATED CIRCUIT WITH CAPACITIVE FUNCTION

PRIORITY CLAIM

The present application is a Continuation in Part of copending International Patent Application Serial No. PCT/EP2011/006449, filed Dec. 20, 2011; which claims the benefit of Italian Patent Application Serial No. VI2010A000339, filed Dec. 20, 2010, all of the foregoing applications are incorporated herein by reference in their entireties.

TECHNICAL FIELD

An embodiment refers to a connection structure having the function of a pad including a capacitive element and suitable for being used during the testing step of electronic components in a substrate and/or as a circuit element in the final application of the integrated circuit. An embodiment also refers to a system including a connection structure and one or more circuit elements coupled to said connection structure.

BACKGROUND

Thanks to the progress in the field of production processes of integrated electronic circuits, electronic components have become smaller, thus allowing the production of substrates including a large number of integrated circuits. It is also possible to produce compact electronic circuits including a large number of components and consequently the density of the connection terminals suitable for coupling the integrated electronic circuits has also drastically increased. The latest generation of devices thus have a large number of terminals or pads to place in contact, which have a small area and are often very close to one another.

After having been formed in the substrate of a wafer, the integrated circuits are tested so as to be able to optionally remove defective components or repair them if possible. The functionality of each integrated circuit in the substrate is checked by means of suitable probes that make contact with the connection terminals or pads of the integrated circuit itself that is under test and that in the jargon is called DUT (Device Under Test). During the testing process an ATE (Automatic Test Equipment) or tester is electrically coupled to the wafer on which the electronic components are formed. The interface between the ATE and the wafer is a probe card, including a PCB (printed circuit board) and a plurality of probes that electrically couple the ATE with the pads of the devices under test. In general, the wafer is arranged on a support called a chuck belonging to an apparatus called a prober.

The pads commonly used in the building of integrated circuits can have very complex and articulated mechanical structures. A structure for a pad suitable for reducing the risk of delamination and microfractures after high mechanical stresses of the assembly process is described in US 2002/0179991 A1, which is incorporated by reference.

Moreover, in the literature there are various known mechanical structures for pads, which have the purpose of increasing the reliability of the assembly and packaging process and of making the surface of the pad rough so as to increase the adhesion of the wire bond on the pad itself. The increasing need for electronic applications capable of withstanding increasingly high temperatures has required the introduction of new materials for the pads and for the connections between the pads and the package in order to ensure a good electrical coupling. Such materials strengthen the pad itself and give it different mechanical characteristics with respect to those obtained using conventional materials like aluminum. A material used to manufacture latest-generation pad structures is, for example, nickel, which has a greater hardness than aluminum.

In general, the structure of the pad is designed so as to reduce its parasitic capacitance. In this way it is intended to avoid alterations of the signal received or emitted by the pad like, for example, loss, attenuation, or distortion of the signal.

In the testing operations commonly carried out on integrated circuits or DUTs (Devices Under Test) electromagnetic interfaces are also used that allow the exchange of information between ATE and DUT through wireless communication based on electromagnetic waves. Consequently, both in the ATE and in the DUT there are suitable transmitting and receiving circuits (TxRx) coupled, for example, to capacitive antennae that are very often capacitors. A system such as described above is illustrated in FIG. 23.

For chips with high energy consumption, it may be necessary to also provide the power supply in a conventional manner through probes coupled to the pads of the DUT. Concerning this, the upper surface of the pad 1111 (FIG. 24) is also used as an armature of a capacitor of the wireless communication interface that will be of the capacitive type between the pad itself and a system outside the chip. This situation is schematically illustrated in FIG. 24.

To check the integrated circuits, power lines can also be used, wherein a radio-frequency signal can, for example, be superimposed on the power supply as discussed in US 2009/0224784, which is incorporated by reference.

The use of condensers/capacitors is of great importance in many systems like, for example, testing apparatuses and in particular testing interfaces like probe cards where the capacitors are often used on the power lines.

In the system described in US 2006/0038576, which is incorporated by reference, two MEMS probes are capacitively coupled with a capacitor arranged near to the tips of the probes. However, such a capacitor is present on the probe card and not in the integrated circuit tested. Therefore, if the application for which the chip will be used requires the presence of a capacitor, this will have to be added externally in a subsequent step for the final application. This solution is somewhat disadvantageous because it requires the addition of a capacitor outside of the integrated circuit during the production step of the final system, which must be carried out after the chip has been tested, and this results in an end product of greater size given that the capacitor is coupled and located outside of the integrated circuit.

US 2003/0234415, which is incorporated by reference, describes various ways to make a capacitor in an integrated circuit, for example, how to use MIM (Metal Insulator Metal) capacitors or condensers that use the fringing capacitance. An example of a capacitor that uses the fringing capacitance is illustrated in FIG. 25 *a* where the capacitor is made with coplanar conductive interdigitated structures. Alternatively, the capacitor can also be made vertically as illustrated in FIG. 25 *b*, where such a capacitor is made up of an upper metal layer 2510, a lower metal layer 2520 and vertical structures 2530 that extend alternatively from the upper metal layer 2510 and lower metal layer 2520 and respectively point towards the lower metal layer 2520 and upper metal layer 2510. In order to increase the capacitance of the capacitor just described, it may be possible to use a stack of metal layers and of vertical connections (vias) that create vertical columns.

Another capacitor for use in integrated circuits including more than two terminals is described in US 2007/0102788, which is incorporated by reference, and is obtained by creating spirals formed on different metallization layers.

Although the solutions in which the capacitor is integrated in the chip allow a saving in cost and production time, the integrated circuits designed in this way may be large in size since the capacitors occupy a substantial area of the chip.

U.S. Pat. No. 6,476,459, which is incorporated by reference, describes a device in which the capacitor is integrated in the substrate of a chip under other structures like, for example, a pad. An example of such a system is schematically illustrated in FIG. 26 in which the capacitor includes the metal layers 2604 and 2608 situated under the bond pad 2620 and surrounding a circuit (not shown).

Also in this case the capacitor is built as an independent structure and, although such a solution reduces the lateral dimensions of the integrated circuit, it may require a greater vertical area to integrate the capacitor. Indeed, since such a capacitor is below the conventional pad, it may be necessary to design a chip having a greater number of metallization layers in which to create the generic capacitor.

A problem of the structures described above is that the capacitive elements integrated in the chip occupy a large portion of its substrate, thus causing an increase in the size of the integrated circuit itself and in its cost.

SUMMARY

Given the aforementioned problems with the existing technology, an embodiment is an integrated circuit in which a capacitor, which usually is of substantial size, can be integrated reducing as much as possible the space occupied by the capacitor itself with the aim of producing a chip of small size, and also reducing the manufacturing costs.

An embodiment includes making an integrated circuit in which the capacitor is formed by exploiting structures already existing and belonging to other circuit elements. For example, one may create a microelectronic structure that is a pad and contains at least one capacitor. In particular, instead of reducing the parasitic capacitance of the pad, it is enhanced in order to create at least one capacitor inside the pad itself.

According to an embodiment, a connection structure suitable for being used in an integrated circuit includes a plurality of metallization layers. The connection structure includes a first metal layer suitable for being coupled to one or more circuit elements outside of the integrated circuit, and a conductive structure suitable for being coupled to one or more circuit elements inside the integrated circuit. The conductive structure and the first metal layer are positioned so as to respectively form at least one first and a second electrode/armature of a capacitive structure.

According to an embodiment, the capacitive element is integrated in the connection structure and is made exploiting elements of the connection structure. In particular, the layer of metal in the first metallization layer has the dual function of a connection terminal and of an armature of a capacitor. In this way the capacitor does not have to be integrated as a self-standing structure in the chip, thus contributing to reducing the overall size of the integrated circuit. Moreover, since the capacitor is made by exploiting structures belonging to other components, like a connection pad, the number of steps needed to make the circuit is reduced, contributing to simplifying and speeding up the production process, and reducing the production costs.

Usually, it is attempted to reduce as much a possible the parasitic capacitance of the interconnection structures integrated in a chip so as to be able to use them without distinction for high- and low-frequency signals. In reality, only some interconnection structures of the chip will be used for high-frequency signals, and some of them can then be coupled to integrated capacitors.

Therefore, this interconnection structure with a capacitive element can be advantageously used for interconnection structures where there are low-frequency signals, or more generally where the capacitive element does not appreciably alter the signal itself, or where there would still be a capacitive element coupled to the interconnection structure through which high frequency signals also pass. This interconnection structure with a capacitive element can also be used to eliminate the presence of undesired high-frequency signals. Moreover, where necessary, it may be possible to make the capacitive element with shield structures so as to minimize its influence on the signals that pass through the interconnection structure.

BRIEF DESCRIPTION OF THE DRAWINGS

The attached figures are incorporated into the description and form part thereof in order to illustrate one or more embodiments. The aforementioned figures together with the description are to explain the principles of the disclosure. The figures are provided for the sole purpose of illustrating preferred and alternative examples of how one or more embodiments can be made and used, and should not be interpreted to limit the disclosure or claims to just the embodiments illustrated and described. Characteristics and advantages will become clear from the following and more detailed description of the one or more embodiments, as illustrated in the attached figures, in which the same numbers refer to the same elements.

FIGS. 4 to 12 are schematic drawings illustrating a cross section of connection structures used in the integrated circuit of the figures according to different embodiments;

FIGS. 13 to 22 are diagrams illustrating circuits including a connection structure according to alternative embodiments;

DETAILED DESCRIPTION

In the following description, for explanatory purposes specific details are provided in order to allow a clear understanding of concepts of the present disclosure. However, it is clear that one or more embodiments can be made without using such specific details. Moreover, well-known structures and components may be described only in their general form so as to make their description easier.

A problem forming the basis of an embodiment is based on the need to produce microelectronic components of increasingly small size, thus reducing the costs.

Moreover, an embodiment is based on the observation that in integrated circuits or chips possible capacitive elements are integrated in dedicated areas of the chip and in general when designing the integrated circuit it is attempted to eliminate the parasitic capacitance in the pads so as to avoid alterations of the functionalities of the pad itself. This means that a substantial area of the integrated circuit is occupied by capacitive structures that are extremely bulky, thus setting a limit to the possibility of reducing the size of the integrated circuit.

According to an embodiment, the capacitive structures are integrated in the structure of a normal connection pad used to couple circuit elements of the integrated circuit with other circuits in the integrated circuit itself or with external systems or apparatuses. In particular, a connection structure includes, on the upper metallization layer, a connection terminal suitable for being coupled to one or more circuit elements of the integrated circuit and/or to circuits and/or apparatuses outside the integrated circuit. The connection structure also includes a conductive element on a metallization layer below the connection terminal. The metallic connection terminal and the conductive element are positioned so as to form a first and a second armature of a capacitor. The conductive element can have different shapes and sizes. In an embodiment, the conductive element can be a metal layer.

Figure 1:
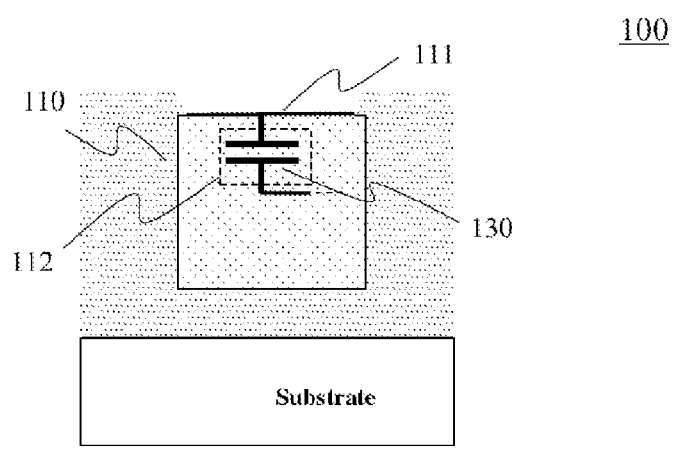
FIG. 1 is a schematic drawing illustrating a portion of an integrated circuit including a connection structure according to an embodiment.

FIG. 1 illustrates a longitudinal section of a portion of an integrated circuit or chip 100 including a connection structure with a capacitive element or CPAD 110 suitable for coupling circuit elements of the integrated circuit with circuits outside of it. The connection structure includes a first metal layer 111 that can be used as a connection pad or terminal and a conductive structure 130. The first metal layer 111 and the conductive structure 130 are arranged so as to form two armatures of a capacitive structure or capacitor 112. Moreover, the connection structure 110 includes a conductive element (not shown) coupled to the connection terminal itself.

The conductive element can be used to couple the connection terminal 111 or pad to other circuits (not shown) present in the chip 100 that can be inside or outside the connection structure. The capacitor 112 can also be in turn coupled to the terminal 111 or to circuits of the chip 100 outside the connection structure 110.

The connection structure 110 can also include a mechanical reinforcement structure (not shown) of conductive material so as to allow it to withstand mechanical stresses due for example to the assembly process. Said mechanical reinforcement structure can be coupled to the first metal layer 111 and arranged so as to increase the capacity of the capacitive structure 112.

Figure 2:
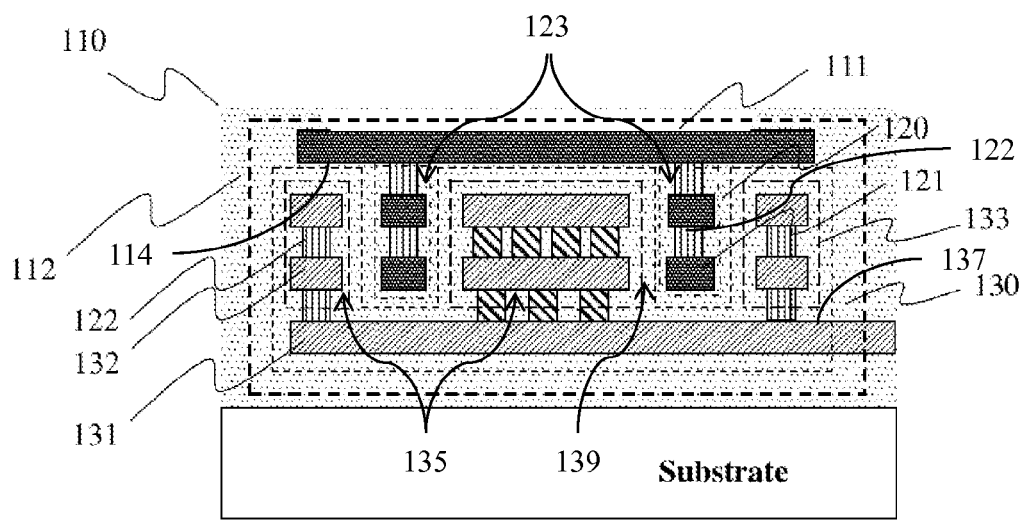
FIG. 2 is a schematic drawing illustrating a longitudinal section of a connection structure used in the integrated circuit of FIG. 1 according to an embodiment.

FIG. 2 illustrates a longitudinal section of the connection structure 110.

The structure 110 includes at least one first metal layer 111 formed on an upper metallization layer of the connection structure 110 and that can be used as a connection terminal. The first metal layer 111 is formed with an electrically conductive material and can be selected so as to be mechanically hard. In some applications it may be preferable, for the first metal layer 111, to use a material that also has mechanical properties, like, for example, nickel, cobalt, their alloys or materials with mechanical and magnetic characteristics similar to those of the materials listed above. In this way, the connection pad 110 has a good resistance to mechanical stress.

The connection structure 110 of FIG. 2 includes a plurality of metallization layers where the first metal layer 111 occupies the upper metallization layer and can be used as a connection terminal. The connection structure 110 can also include at least one mechanical reinforcement structure 120 formed by a plurality of stacks 123. The stacks 123 of the mechanical reinforcement structure 120 can be formed using metal and vias and it has the function of strengthening the connection structure 110, which is generally subjected to substantial mechanical stress due, for example, to the probing process and to the assembly process. The mechanical reinforcement structure 120 can also at least in part have an electrical function so as to be able to conduct an electric current and thus also have a capacitive function so as to be able to be used at least in part as an armature of a capacitor. The various materials used to form the mechanical reinforcement structure 120 can also be formed from different layers, depending on the purpose, having suitable electrical and/or mechanical characteristics. The mechanical reinforcement structure 120 can be a vertical stack 123 that extends from a bottom surface 114 of the first metal layer 111 towards the inside of the connection structure 110 and includes at least one discontinuous layer of metal formed in at least one lower metallization layer situated below the first metal layer 111. The discontinuous layer of metal includes a plurality of metallic sub-structures (lines) 121 possibly intercoupled by through holes or vertical interconnect accesses 122 (vias). The mechanical reinforcement structure 120 stacks 123 can be coupled to the bottom surface 114 of the first metal layer 111 through at least one vertical interconnect access 122.

The metallic sub-structures 121 can have various shapes and sizes but still be such as to ensure the correct operation of the connection structure 110, in accordance with the operating frequencies of the connection structure 110. For example, by making the connection terminal 111 with a mechanically hard material, the upper part of the connection structure 110 is strengthened so as to reduce the size of the metallic sub-structures 121. Moreover, by increasing the thickness of the connection terminal 111, it may be possible to ensure greater mechanical strength of the connection structure 110.

The connection structure 110 also includes a conductive structure 130 including a second metal layer 131 formed in a lower metallization layer of the connection structure 110. The second metal layer 131 can be coupled to one or more integrated circuits in a chip including the connection structure 110. The coductive structure 130 also includes at least one second discontinuous layer of metal 132 coupled to the second metal layer 131 through at least one vertical interconnect access 122 so as to form a vertical structure 133 including a plurality of stacks 135 that extends from an upper surface 137 of the second metal layer 131 towards the inside of the connection structure 110 so as to occupy the gaps 139 between two metallic sub-structures 121 forming the mechanical reinforcement structure 120. In this way the conductive structure 130, and the structure including the connection terminal 111 and the mechanical reinforcement structure 120, are interdigitated, thus constituting a first and a second armature of a capacitor 112 that uses the fringing capacitance so as to increase the capacitance of the capacitor 112.

Even if in the system illustrated in FIG. 2 the mechanical reinforcement structure 120 includes two discontinuous layers of metal formed from metal lines 121 in two different metallization layers, the mechanical reinforcement structure 120 could include an arbitrary number of discontinuous layers of metal coupled together by vias 122.

Similarly, the conductive structure 130 can have different shapes according to the characteristics of the connection structure 110 and the function of the capacitive structure 112, as will be shown hereafter with reference to the other embodiments. In particular, even if the conductive structure 130 of FIG. 2 includes two discontinuous layers of metal formed from metal lines 132, the conductive structure 130 could include an arbitrary number of discontinuous layers of metal coupled together by vias 122.

In other words, the conductive structure 130 includes a second metal layer 131 in a metallization layer below the first metal layer 111 and at least one first discontinuous layer of metal 132 coupled to the second metal layer 131. Moreover, the mechanical reinforcement structure 120 includes at least one second discontinuous layer of metal 121 coupled to the first metal layer 111 so that the first discontinuous layer of metal and the second discontinuous layer form an interdigitated capacitive structure.

Figure 3:
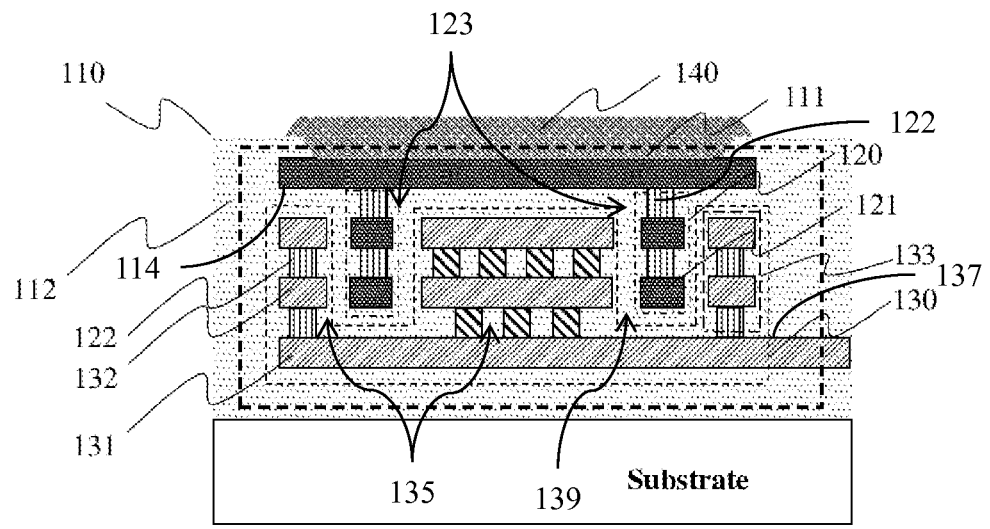
FIG. 3 is a schematic drawing illustrating a longitudinal section of a connection structure used in the integrated circuit of FIG. 1 according to a further embodiment.

FIG. 3 is a longitudinal section of an alternative configuration of the connection structure 110, and the elements of the structure of FIG. 3 already described with reference to FIG. 2 will not be described any further. In the embodiment of FIG. 3 the first metal layer 111 is coated by an outer metal layer 140 formed by a mechanically hard and electrically conductive material like nickel, cobalt, an alloy thereof, or any other material having electrical, mechanical and magnetic properties similar to those of the materials listed above. The outer metal layer 140 further strengthens the connection structure 110. Consequently, the mechanical reinforcement structure can be reduced or, at the limit, eliminated. According to this configuration (not shown), the capacitive surfaces forming the armatures of the capacitor 112 can be reduced, in such a way reducing the overall capacitance of the capacitor 112 so as not to influence the behavior of the connection structure 110. Otherwise, the mechanical structures 120 and the vertical structures 133 can be made narrower and denser to increase the overall capacitance of the capacitor 112, according to the design requirements.

Figure 4:
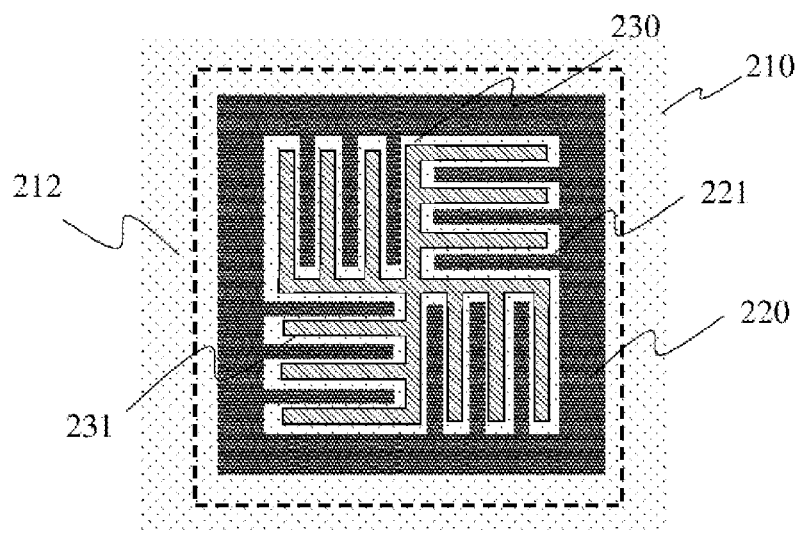

FIG. 4 shows a horizontal section of a connection structure 210 according to an embodiment. The connection structure 210 includes a lateral mechanical structure 220 that extends along the outer perimeter of the connection structure 210. In the embodiment of FIG. 4, the lateral mechanical structure 220 is shaped like a crown with square section, but this is not a required feature, according to which the mechanical structure 220 can have a circular, elliptical, or similar section. The mechanical structure 220 is coupled to the first metallic layer 111 (not visible in the figures) and each of its sides includes a plurality of metallic plates 221 that extend towards the center of the connection structure 210. The connection structure 210 also includes a conductive structure 230 including a plurality of conductive plates 231. The conductive structure is arranged inside the mechanical reinforcement structure 220 so that each of the conductive plates 231 is arranged between two metallic plates 221 of the mechanical reinforcement structure or else between a metallic plate 221 and a side of the mechanical reinforcement structure 220. In this configuration, the conductive structure 230 forms a first armature of a capacitor 212 whereas the mechanical reinforcement structure 220 forms a second armature of a capacitor 212. In this embodiment both of the armatures are interdigitated so as to increase the capacitance of the capacitor 212. FIG. 4 shows a horizontal section of a metallization layer of the connection structure 210; however, the mechanical structure 220 and the conductive structure 230 can be formed on many metallization layers according to the requirements and the function of the connection structure 210. The various layers of the mechanical and conductive structures 220 and 230 can be intercoupled through vias 122 (not shown).

Although the mechanical structure 220 includes a plurality of metallic plates 221 on every side, it may be possible to have a mechanical structure having metallic plates 221 only on some of its sides.

In FIG. 5 the mechanical reinforcement structure 220 includes a plurality of metallic plates 221 that extend from one side of the mechanical structure 220 towards the inside of the connection structure 210. The elements of FIG. 5 already described with reference to FIG. 4, like for example the conductive structure 230, will not be described any further.

In order to increase the capacitance of the capacitor 212, the metallic plates 221 and the conductive plates 231 can include sub-structures in the form of protuberances 222 and 232 that extend perpendicular to the surfaces of the metallic and conductive plates 221 and 231. The mechanical structure 220 and the conductive structure 230 can be arranged so that the metallic and conductive plates 221 and 231 and the protuberances 222 and 232 are interdigitated. Such a structure is illustrated in FIG. 6.

FIG. 7 shows a connection structure 210 where the mechanical structure 220 includes a plurality of metallic plates 221 on two opposite sides and extending towards the inside of the connection structure 210. In this embodiment the conductive structure 230 that defines the first armature of the capacitor 112 is coil-shaped.

FIG. 8 shows a connection structure 310 in which a mechanical reinforcement structure 320 includes a plurality of metallic plates 321 coupled so as to form a coil. The connection structure 310 also includes a conductive structure 330 shaped like a coil and positioned inside the connection structure 310 so that every conductive plate 331 forming the conductive structure 330 is positioned between two metallic plates 321 forming the coil of the mechanical structure 320.

Figure 9:
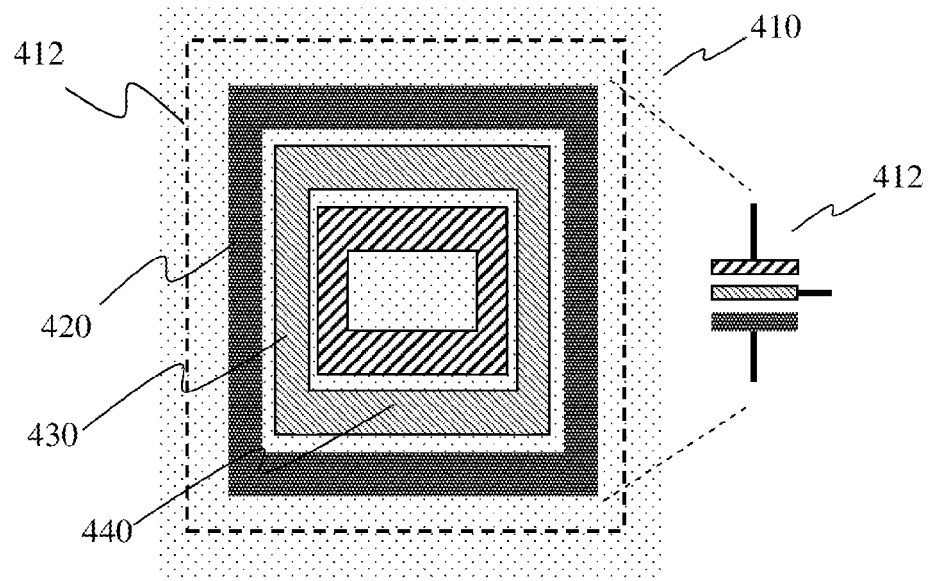

FIG. 9 shows a connection structure 410 including a lateral mechanical structure 420 that extends along the outer perimeter of the connection structure 410. The mechanical structure 420 is coupled to the first metallic layer 111 (not visible in the figures). The connection structure 410 also includes a first and a second conductive structure 430 and 440 shaped like a crown with a square section. The perimeter of the conductive structures 430 and 440 is such that such structures can be positioned inside the mechanical structure 420 so as to form the armatures of a coaxial capacitor with three armatures 412.

In the embodiment of FIG. 9, the lateral mechanical structure 420 and the conductive structures 430 and 440 are shaped like a crown with square section but this is not limiting; for example, such structures can have a circular, elliptical, and similar section. Moreover, although in the embodiment of FIG. 9 the conductive structures 430 and 440 are inside the mechanical structure 420, in other embodiments one or both of the conductive structures 430 and 440 can be larger than the mechanical structure 420 and be positioned outside of it.

According to embodiments, it may also be possible to create armatures outside of the mechanical structure of the pad. In this case there is a capacitor with three armatures, one of which consists of part of the mechanical structure of the pad itself.

Figure 10:
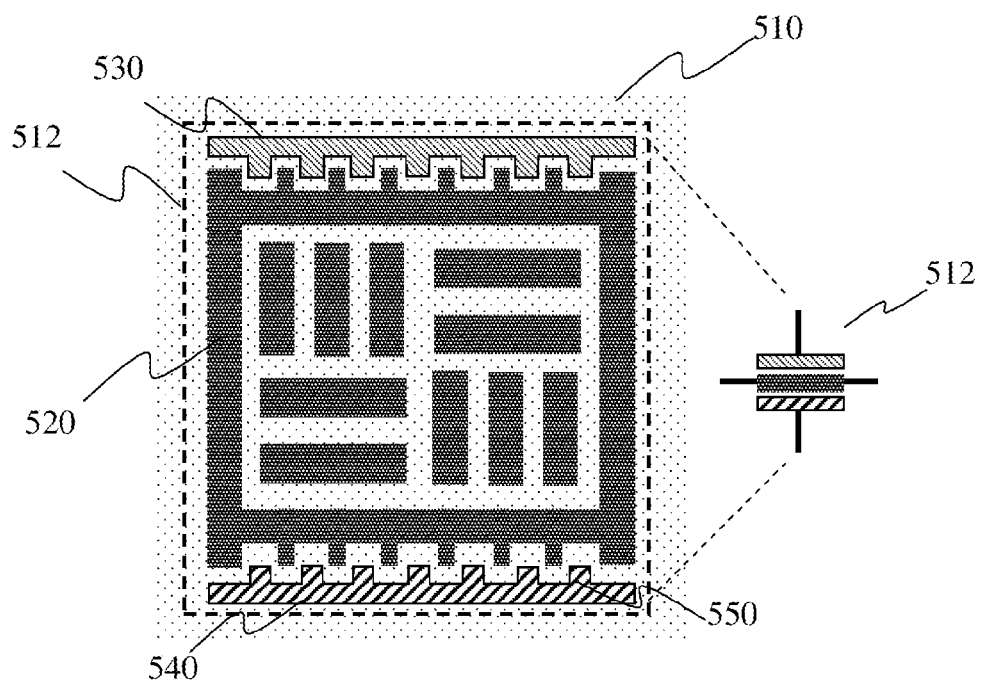

FIG. 10 shows an embodiment such as described above. A connection structure 510 includes a lateral mechanical structure 520 that extends along the outer perimeter of the connection structure 510. The mechanical structure 520 is coupled to the first metallic layer 111 (not visible in FIG. 10). The connection structure 510 also includes a first and a second conductive structure 530 and 540 formed outside of the mechanical structure 520 and respectively arranged in front of two opposite sides of the mechanical structure 520. The first and the second conductive structure 530 and 540 and the mechanical structure 520 form three armatures of a capacitor 512. In order to increase the capacitance of the capacitor 512, the conductive structures 530 and 540 and at least the sides of the mechanical structure 520 in front of the conductive structures 530 and 540 can include protuberances 550 arranged so that the first conductive structure 530 and at least one part of the mechanical structure 520, and the second conductive structure 540 and at least one part of the mechanical structure 520 are interdigitated.

The structures 530 and 540 can be coupled together in series to form a single capacitor, or else they can be coupled to two different circuits.

In an embodiment, an armature of the capacitor can be divided into many parts that can be surrounded by another armature that can consist of at least one part of the mechanical structure of the pad.

Figure 11:
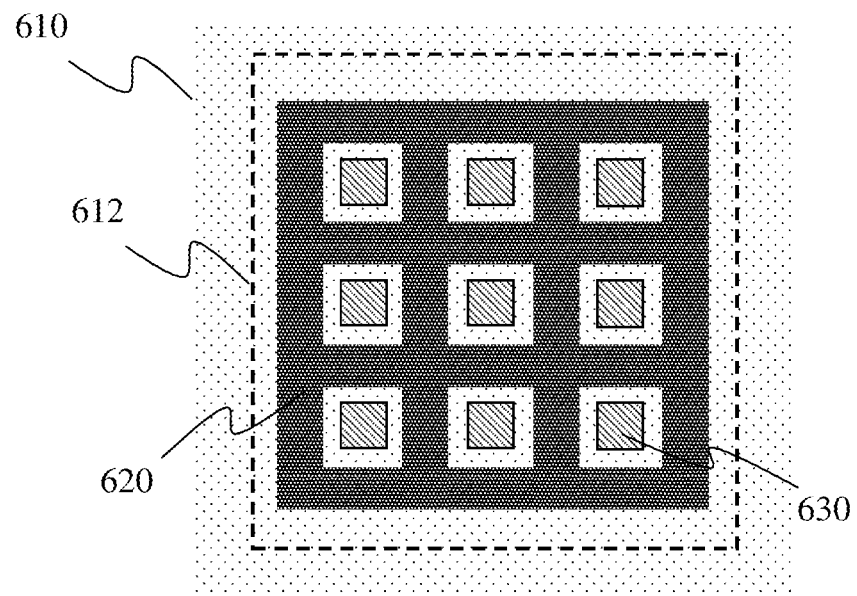

FIG. 11 shows a connection structure 610 including a mechanical structure 620 having a grid section according to an embodiment. The connection structure 610 includes a plurality of vertical conductive structures 630 positioned inside the mechanical lattice structure 620 so that every vertical conductive structure 630 is surrounded by at least one part of the mechanical structure 620.

The vertical structures 630 can include a plurality of discontinuous layers of metal formed in different metallization layers and intercoupled through vias (not shown). The vertical structures 630 can also be coupled to a layer of metal (not shown) formed in the lowest metallization layer of the connection structure and through this to one or more integrated circuits in a chip including the connection structure 610.

In general, the conductive structure can include a second metal layer in a metallization layer below the first metal layer or connection terminal and at least one first discontinuous layer of metal coupled to the second metal layer, and the mechanical reinforcement structure includes at least one second discontinuous layer of metal coupled to the first metal layer and surrounding the conductive structure.

In an embodiment, it may be possible to have more than one capacitor inside the connection structure.

Figure 12:
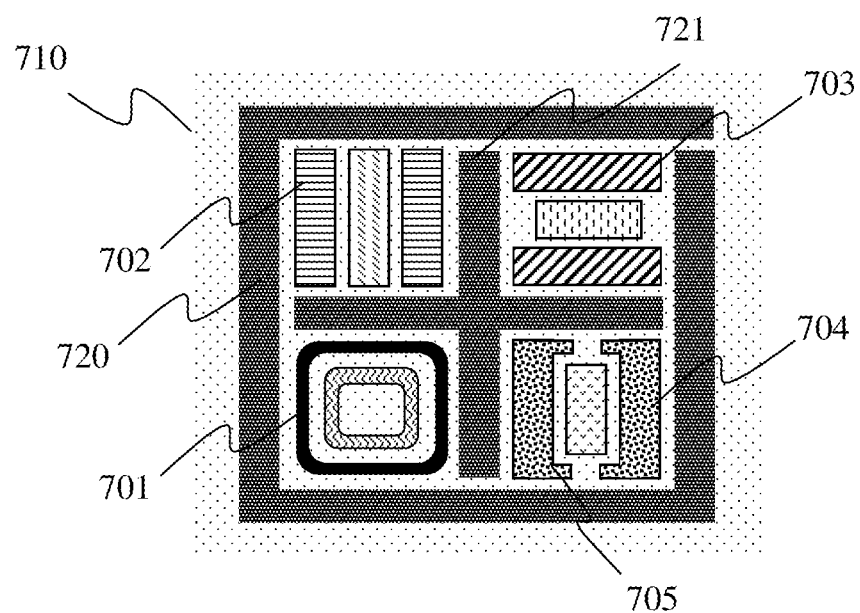

FIG. 12 shows a connection structure 710 including a lateral mechanical structure 720 that extends along the outer perimeter of the connection structure 710 according to an embodiment. Inside the mechanical structure 720, the connection structure includes a first capacitor 701 having armatures coaxial to one another; a second capacitor 702 having a central armature that faces onto two lateral armatures in series with one another; a third capacitor 703, and a fourth capacitor 704 having a central armature that faces onto two lateral armatures in series with one another and having a section that allows the fringing capacitance to be exploited.

Although both of the capacitors 703 and 704 are similar in operation, the fourth capacitor 704 uses the fringing capacitance better thanks to two lateral protuberances 705 included in the lateral armatures of the fourth capacitor 704.

The four capacitors from 701 to 704 are separated and insulated from one another by plates 721 included in the mechanical structure 720 and optionally the plates 721 can be arranged at a suitable potential that can also be different from the potential of the mechanical structure 720.

Of course, the connection structure 710 can have more than four capacitors and their shape and structure is not limited to those described earlier but can vary according to the requirements and the use of the connection structure 710.

Moreover, the connection structures from 110 to 710 can have different sections, like for example: circular, elliptical, polygonal, square, rectangular, hexagonal, octagonal, or similar.

In an embodiment, the capacitor and the connection terminal 111 included in the connection structures from 110 to 710 can be coupled with other circuits inside an integrated circuit as well as being coupled together.

In a first system described schematically in FIG. 13, the capacitor 112-612, 701-704 is coupled to the connection terminal 111 and can be part of a filter. Such a filter can, for example, have the function of eliminating the DC/continuous component of a signal present on the connection terminal 111 or of a signal coming from a circuit 810.

Moreover, such a system can also be used to make a communication interface through a power line in which a circuit 820 is fed through the power line, whereas the circuit 810 forms a transceiver system. In particular the circuit 810 can be a transmitter, a receiver, or a transceiver/transponder.

In a variant of this circuit, shown in FIG. 14, the capacitor 112-612, 701-704 can be coupled to earth becoming a filter capacitor for the power supply. Such a configuration may be particularly helpful in the checking step of an integrated circuit. Indeed, since the filter capacitor is already present in the connection structure integrated in the chip to be tested, the filter capacitors that are commonly formed on the printed circuit board (PCB) of the probe card and coupled to a power supply probe can have a lower capacitance value or, at the limit, can be eliminated, in this way simplifying the probe card.

Moreover, since the capacitor is formed inside an active connection structure 110-710, such a capacitor can also be used in the final application, reducing the production costs of the chip and the size of the end product.

FIG. 15 is a diagram illustrating a system including a connection structure 110-710 and a first and a second capacitor 112-612, 701-704. The system also includes a first circuit 810, which can be a receiver coupled to the connection terminal 111 through the first capacitor 112-612, 701-704 and a circuit 830, that can be a transceiver, coupled to the connection terminal 111 through the second capacitor 112-612, 701-704. The system also includes a circuit 820, which can be fed through a power line.

Figure 16:
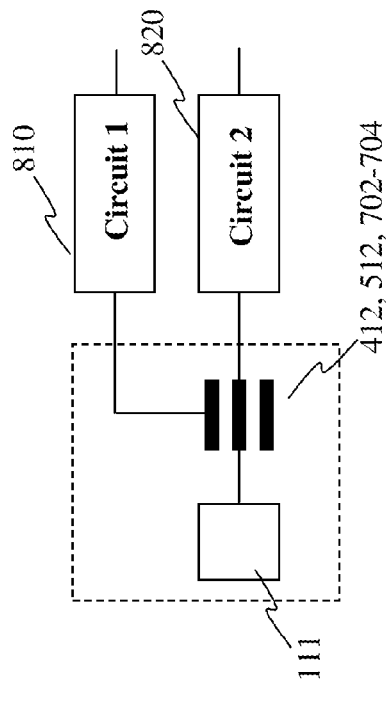

FIG. 16 is a diagram illustrating a system including a connection structure 110-710 and a capacitor 112-612, 701-704 not coupled to the connection terminal 111. In such an embodiment the capacitor 112-612, 701-704 can be used as a conventional capacitor for a circuit 810. Given that the capacitor 112-612, 701-704 is made in the area occupied by the CPAD 110-710, the area of the chip occupied by the circuit can be reduced, in this way contributing to reducing the overall size of the integrated circuit.

To avoid the capacitor appreciably altering the signal of the pad, it may be possible, for example, to use a capacitor with two coaxial armatures. It may also be possible to use one or more shield structures, like, for example, a further coaxial armature that surrounds the outside of the capacitor, which can be placed at a suitable reference potential thus creating an electromagnetic shield.

Such embodiments can be implemented, according to the design needs, in each of the connection structures described earlier.

The structure of the shield can have cavities in order to reduce the surface that faces onto the other structures of the CPAD, thus reducing the capacitive coupling and the parasitic capacitance.

Moreover, it may be possible to couple together, in various ways, the capacitors contained in many CPADs to make capacitors having larger capacitances.

Figure 17:
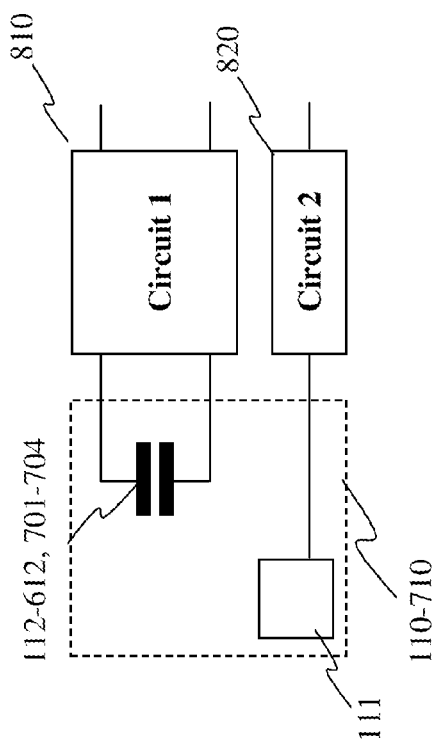

FIG. 17 is a diagram illustrating a system including a connection structure 110-710 and a capacitor with three terminals 412, 512, 702-704 forming part of an EMI (Electro Magnetic Interference) filter to reduce, and at the limit, eliminate, the electromagnetic interference on a second circuit 820 according to an embodiment.

In the system of FIG. 17, a first and a second circuit 810 and 820 are coupled to the connection terminal 111 through the capacitor with three terminals 412, 512, 702-704.

The circuit 810 can form part of the EMI filter, or else it can be a further circuit used, for example, to recover the energy of the electromagnetic disturbances to be stored or use it, for example, to feed at least part of the integrated circuit 100.

Therefore, the circuit 810 can perform the function of an Energy Harvester or Energy Scavenger, where by Energy Harvesting it refers to fields in which the energy source is well known, characterized and regular, whereas Energy Scavenging refers to fields in which the energy source is unknown and highly irregular.

Figure 18:
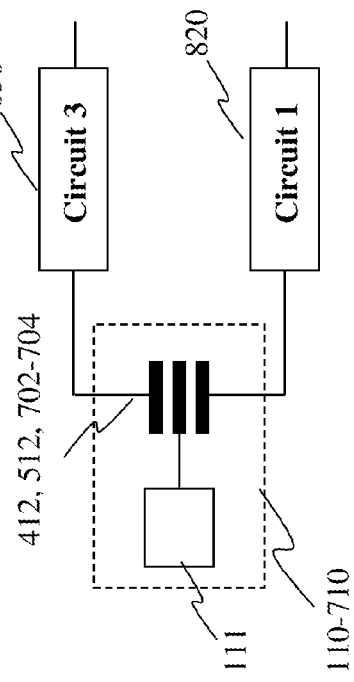

FIG. 18 is a diagram illustrating a system including a connection structure 110-710 and a capacitor with three terminals 412, 512, 702-704. In this embodiment the armature of the capacitor 412, 512, 702-704 is coupled to earth/ground, and a circuit 8320 is coupled to the connection terminal 111 through the capacitor 412, 512, 702-704. Finally, the connection terminal 111 can be coupled to a power or signal line.

Figure 19:
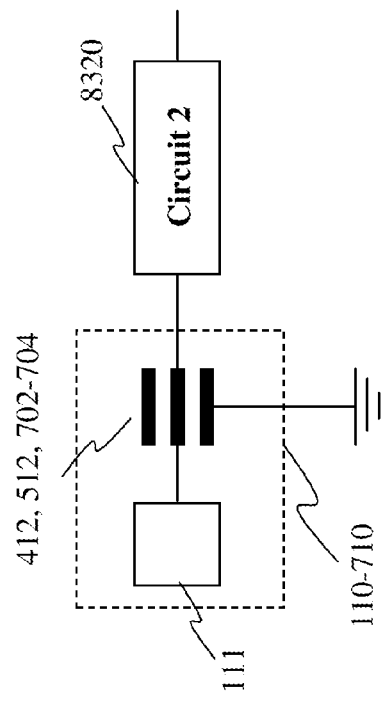

FIG. 19 is a diagram illustrating a system including a connection structure 110-710 and a capacitor with three terminals 412, 512, 702-704. In this embodiment a first circuit 820 and a second circuit 830 are coupled to the connection terminal through distinct armatures of the capacitor with three terminals 412, 512, 702-704.

Figure 20:
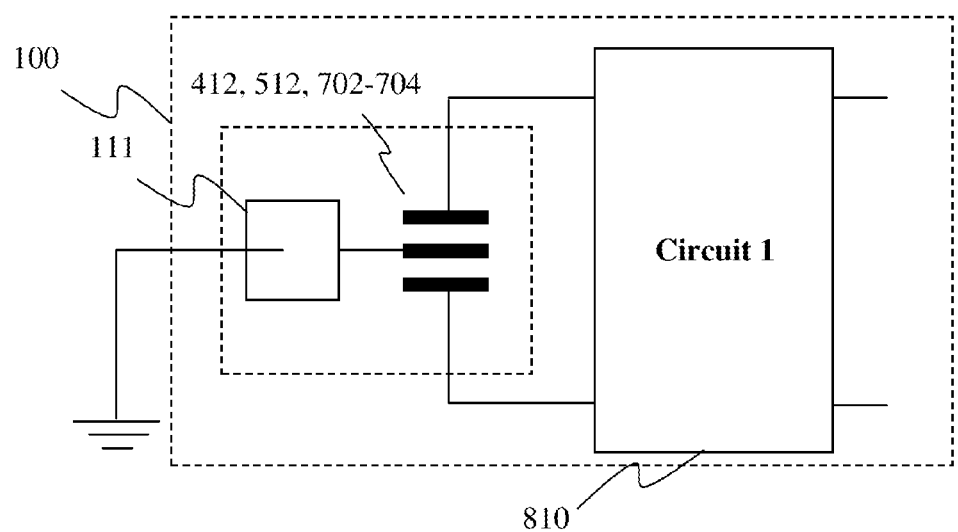

FIG. 20 is a diagram illustrating an embodiment of a system including a connection structure 110-710 with a capacitor with three terminals 412, 512, 702-704. In this system, the pad can be coupled to earth/ground, and this can be used, for example, as a filtering circuit for alternating current (AC) power supplies.

Figure 21:
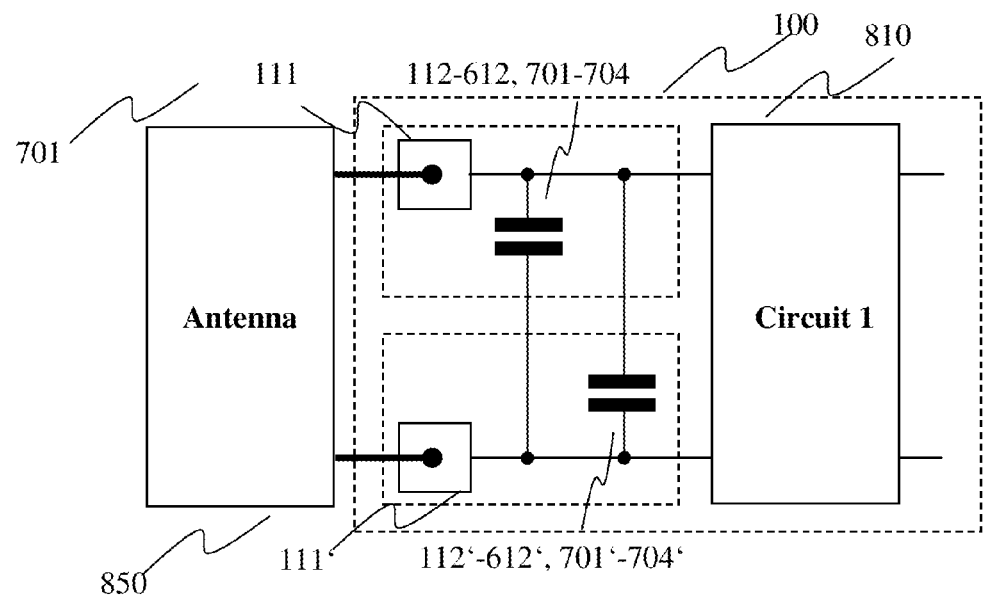

FIG. 21 is a diagram illustrating an embodiment of a chip 100 including a first connection structure 110-710 or CPAD with a first capacitor 112-612, 701-704 and a second connection structure 110'-710' or CPAD with a second capacitor 112'-612', 701'-704'. In this system, the first and the second CPAD are coupled so that the first and the second capacitors are coupled in parallel to one another. In this way it may be possible to increase the overall capacitance to allow an antenna 850 outside the chip 100 to resonate at a very precise frequency. The antenna 850 is coupled to the chip through the first and the second connection terminal 111 and 111'. The connection structures 110-710 and 110'-710' are coupled to a circuit 810 integrated in the chip 100 that can be a transmitter, a receiver or a transceiver/transponder.

The external antenna 850 can be coupled to the CPADs 110-710 and 110'-710' using bumps or wire bonds.

Although in the circuit of FIG. 21 the capacitors 112-612, 701-704 and 112'-612', 701'-704' are coupled in parallel, this configuration is not limiting and it should be understood that the capacitors can also be coupled in series according to the application.

Figure 22:
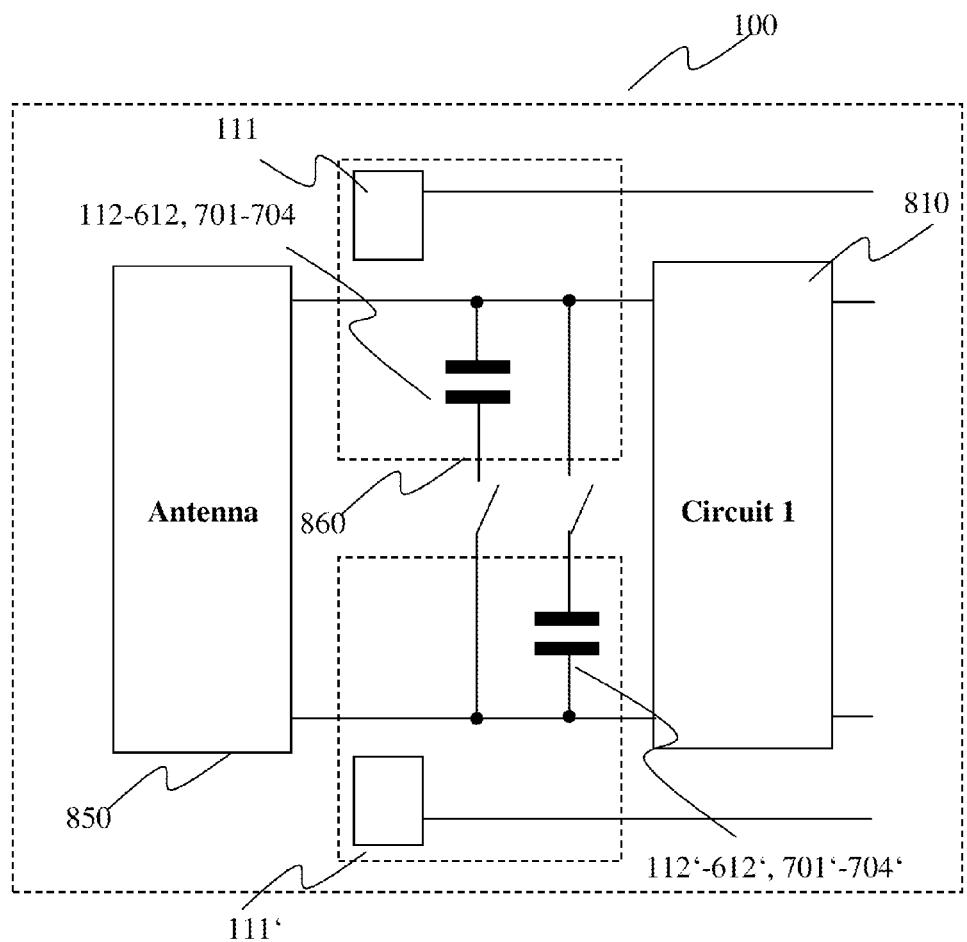
Figure 23:
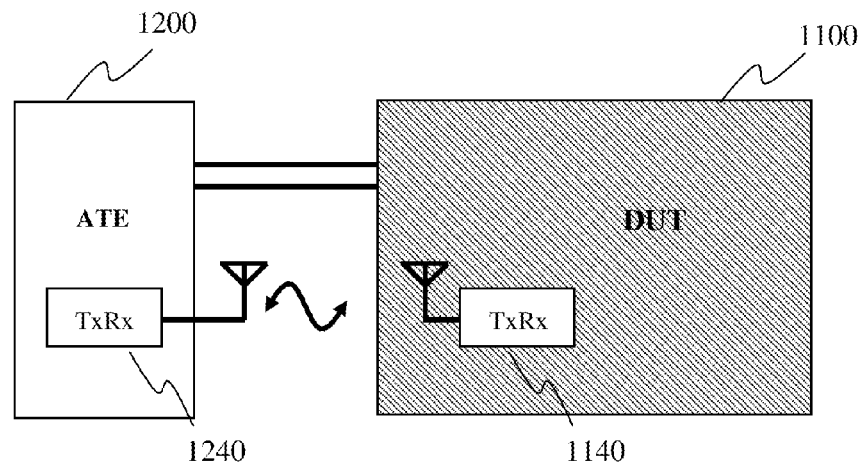
FIG. 23 is a schematic drawing illustrating a conventional testing system.
Figure 24:
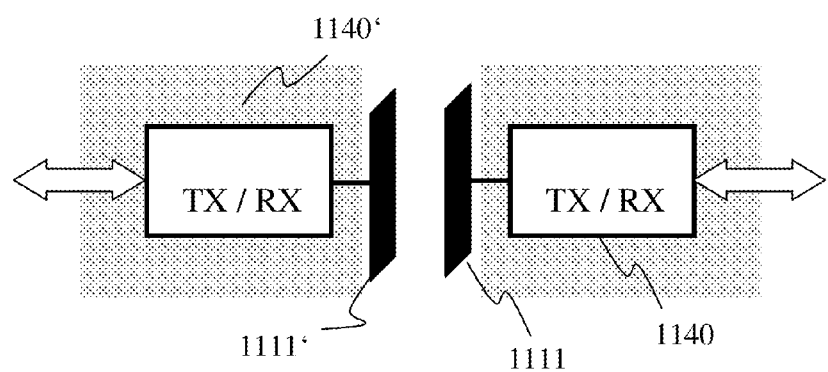
FIG. 24 is a schematic drawing illustrating a system including a conventional transceiver.
Figure 25A:
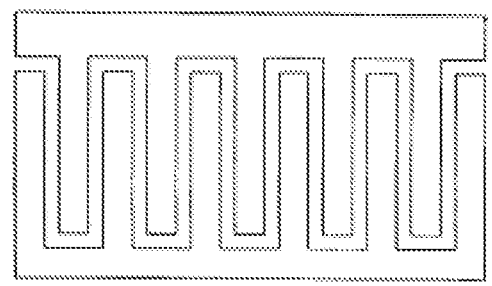
FIGS. 25 a and 25 b are a schematic drawing illustrating a conventional capacitor.
Figure 25B:
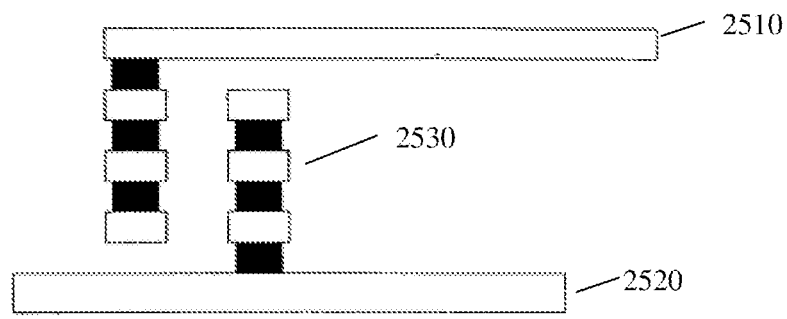
Figure 26:
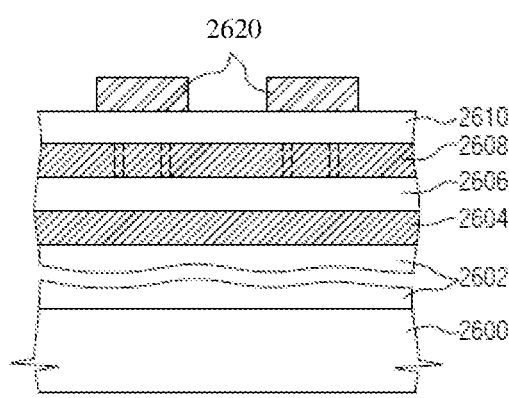
FIG. 26 is a schematic drawing illustrating a conventional connection pad.

In an embodiment according to FIG. 22, the antenna 850 can also be inside the chip 100, and the capacitors 112-612, 701-704 and 112'-612', 701'-704' can also have different capacitance values, and there can be electronic switches 860, which can be made, for example, through at least one transistor MOS or similar. Through said electronic switches it may be possible to couple or uncouple at least one of the capacitors 112-612, 701-704 and 112'-612', 701'-704', in this way varying the resonant frequency of the antenna.

Since the antenna 850 is coupled to an active connection structure, such an antenna 850 can be used both to check the chip 100 and for the final application.

Of course, it may be possible to make hybrid structures and systems with respect to embodiments and in combination with the prior art.

In the connection structure 110 described with reference to FIGS. 1 to 12, the capacitor 112 is integrated inside the structure itself, but in some embodiments the capacitor 112 can be in part inside and/or outside of the mechanical structure of the connection pad 110.

The at least one capacitor and the connection terminal 111 can have connections with other circuits inside the integrated circuit as well as being coupled together according to the purpose and the use of the connection structure.

The various parts can also be electrically insulated from one another, for example, using insulating materials like oxides or dielectric materials. Such dielectric materials can also be present optionally between the at least two armatures of a capacitor 112-612, 701-704 to increase its capacitance, possibly reducing its size and, therefore, its impact on the operation of the connection structure 110-710 or CPAD.

Of course, in order to satisfy contingent and specific requirements, one can make modifications to the above-described embodiments. Although one or more embodiments have been described, it should be clear that various omissions, replacements, and modifications in the shape and in the details, just like other even hybrid embodiments, may be possible also in combination with the prior art; it should be understood that specific elements and/or method steps described in relation to any embodiment described can be incorporated in any other embodiment in combination with the prior art as general aspects of design choices.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A terminal structure for an integrated circuit chip, comprising:
    a connection pad within the integrated circuit chip and forming an electrode of a first capacitor, wherein at least a portion of an upper surface of the connection pad is exposed through an opening of the integrated circuit chip, said exposed portion of the upper surface configured for making an electrical connection outside of the integrated circuit chip; and
    a first conductor disposed within the integrated circuit chip and forming another electrode of the first capacitor that is directly connected to a ground of the integrated circuit chip;
    wherein the opening for the exposed portion of the connection pad and the first conductor are vertically aligned with each other in a direction perpendicular to said upper surface;
    a mechanical reinforcement structure comprising a plurality of first stacks of at least two vias and two metal lines that are electrically connected to, and extend perpendicularly from, a bottom surface of the connection pad; and
    a plurality of second stacks of at least two vias and two metal lines that are electrically connected to, and extend perpendicularly from, an upper surface of the first conductor;
    wherein at least one of the second stacks is positioned in a gap between two of the first stacks and adjacent to the connection pad.

2. The terminal structure of claim 1 wherein the first conductor is parallel to the connection pad.

3. The terminal structure of claim 1:
wherein each first stack forms a second conductor electrically coupled to the connection pad and extending through the integrated circuit chip from the connection pad toward the first conductor; and
wherein each second stack forms a third conductor electrically coupled to the first conductor, extending through the integrated circuit chip from the first conductor toward the connection pad, and laterally adjacent to the second conductor.

4. The terminal structure of claim 1, wherein a metal line of the first stack is electrically coupled to the connection pad is disposed at a same level as a metal line of the second stack electrically coupled to the first conductor.

5. The terminal structure of claim 1, further including a second conductor forming an electrode of a second capacitor that has another electrode formed by one of the connection pad and first conductor.

6. The terminal structure of claim 1, further including a second conductor disposed at a same level as the first conductor and forming an electrode of a second capacitor that has another electrode formed by one of the connection pad and first conductor.

7. The terminal structure of claim 1, further including:
a second conductor galvanically isolated from the connection pad and first conductor and forming an electrode of a second capacitor; and
a third conductor galvanically isolated from the connection pad and first conductor and forming another electrode of the second capacitor.

8. The terminal structure of claim 1, wherein the connection pad comprises a further conductor and an outer metal layer coated on an upper surface of the further conductor within the opening formed in the integrated circuit chip.

9. An integrated circuit chip, comprising:
a plurality of metallization layers including:
an upper metallization layer having an upper surface exposed by an opening formed in said integrated circuit chip; and
another metallization layer below the upper metallization layer directly connected to a ground of the integrated circuit chip;
wherein the opening exposing the upper surface of the upper metallization layer and the another metallization layer are vertically aligned with each other in a direction perpendicular to said exposed upper surface; and
wherein the upper metallization layer and said another metallization layer form first and second plates of a capacitor; and
wherein said plurality of metallization layers further include at least one further metallization layer positioned between the upper and another metallization layers, said at least one further metallization layer configured to form:
a mechanical reinforcement structure comprising a plurality of first stacks, wherein each first stack comprises a metal line formed from the at least one further metallization layer with a via electrically connected to a bottom surface of the upper metallization layer; and
a plurality of second stacks, wherein each second stack comprises a metal line formed from the at least one further metallization layer with a via electrically connected to an upper surface of the another metallization layer;
wherein at least one of the second stacks is positioned in a gap between two of the first stacks.

* * * * *

UNITED STATES PATENT AND TRADEMARK OFFICE
CERTIFICATE OF CORRECTION

| | | |
|---|---|---|
| PATENT NO. | : 9,257,499 B2 | Page 1 of 1 |
| APPLICATION NO. | : 13/914820 | |
| DATED | : February 9, 2016 | |
| INVENTOR(S) | : Alberto Pagani | |

It is certified that error appears in the above-identified patent and that said Letters Patent is hereby corrected as shown below:

On the Title Page:

Please amend the Related U.S. Application Data as follows:

Related U.S. Application Data
(63)   Continuation-in-part of application No. PCT/EP11/06449, filed on [Dec. 20, 2001] -- Dec. 20, 2011 --.

Signed and Sealed this
Nineteenth Day of July, 2016

Michelle K. Lee
*Director of the United States Patent and Trademark Office*